(12) United States Patent
Chesneau et al.

(10) Patent No.: US 11,171,565 B2
(45) Date of Patent: Nov. 9, 2021

(54) SWITCHED-MODE POWER CONVERTER

(71) Applicant: STMicroelectronics (Grenoble 2) SAS, Grenoble (FR)

(72) Inventors: David Chesneau, Grenoble (FR); Helene Esch, Seyssinet Pariset (FR); Francois Amiard, Proveysieux (FR)

(73) Assignee: STMicroelectronics (Grenoble 2) SAS, Grenoble (FR)

( * ) Notice: Subject to any disclaimer, the term of this patent is extended or adjusted under 35 U.S.C. 154(b) by 0 days.

(21) Appl. No.: 16/584,147

(22) Filed: Sep. 26, 2019

(65) Prior Publication Data

US 2020/0112252 A1    Apr. 9, 2020

(30) Foreign Application Priority Data

Oct. 5, 2018 (FR) ........................ 1859261

(51) Int. Cl.
*H02M 3/158* (2006.01)
*H03F 1/02* (2006.01)

(52) U.S. Cl.
CPC ........ *H02M 3/1582* (2013.01); *H03F 1/0205* (2013.01)

(58) Field of Classification Search
CPC ... H02M 3/1582; H02M 3/157; H03F 3/2173; H03F 3/082; H03F 3/181; H03F 3/2171; H03F 3/38; H03F 3/345; H03F 3/185; H03F 1/0205; H03F 1/3025; H03F 1/34; H03F 1/3211; H03F 1/26

See application file for complete search history.

(56) References Cited

U.S. PATENT DOCUMENTS

| | | | |
|---|---|---|---|
| 6,307,433 B1 | 10/2001 | Ikeda | |
| 9,246,390 B2* | 1/2016 | Lopata | ............... H02M 3/1588 |
| 2006/0082414 A1 | 4/2006 | Xu et al. | |
| 2012/0326790 A1* | 12/2012 | Stochino | ............... H03F 1/3229 330/278 |
| 2014/0266118 A1* | 9/2014 | Chern | .................. H02M 3/156 323/283 |
| 2015/0214902 A1 | 7/2015 | Lin | |
| 2018/0337642 A1* | 11/2018 | Lu | ........................... H03F 1/086 |

FOREIGN PATENT DOCUMENTS

EP    1503496 A1    2/2005

* cited by examiner

*Primary Examiner* — Nguyen Tran
(74) *Attorney, Agent, or Firm* — Slater Matsil, LLP

(57) ABSTRACT

In an embodiment, A device includes an operational amplifier and a feedback loop. The feedback loop is coupled between a first input of the operational amplifier and an output of the operational amplifier. The feedback loop is controllable according to a saturation of the operational amplifier. In one example, the device is incorporated in a microcontroller.

21 Claims, 4 Drawing Sheets

SWITCHED-MODE POWER CONVERTER

CROSS-REFERENCE TO RELATED APPLICATIONS

This application claims priority to French Application No. 1859261, filed on Oct. 5, 2018, which application is hereby incorporated herein by reference.

TECHNICAL FIELD

The present disclosure generally concerns electronic circuits, and, in particular embodiments, to a switched-mode power converter.

BACKGROUND

In a switched-mode power converter, a DC voltage, delivered to an input of the converter, is chopped by switching of one or a plurality of cut-off switches to implement phases of power storage in an inductive element and phases of discharge, towards a load connected to the converter output, of the power stored in the inductive element.

Known switched-mode power converters have various disadvantages.

SUMMARY

Some embodiments relate to a DC/DC power converter, of switched-mode power supply type, which converts a DC voltage into another DC voltage.

An embodiment provides a switched-mode power converter which overcomes all or part of the disadvantages of usual switched-mode power converters.

An embodiment more particularly overcomes all or part of the disadvantages associated with the saturation of an error amplifier of a device such as a switched-mode converter.

An embodiment provides a device comprising: an operational amplifier; and a feedback loop connected between a first input of the amplifier and an output of the amplifier, the feedback loop being controllable according to the saturation of the amplifier.

According to an embodiment, the feedback loop comprises a switch connected between the first input and the output of the amplifier, or a controllable variable resistor connected between the first input and the output of the amplifier.

According to an embodiment, the device further comprises an amplifier saturation detection circuit, configured to control the feedback loop, preferably to decrease or take down to zero the impedance of the feedback loop when the amplifier saturates.

According to an embodiment, the circuit is configured to detect a saturation of the amplifier and to control the feedback loop from an internal signal of the amplifier.

According to an embodiment, the amplifier comprises a first transistor having a conduction terminal forming the output of the amplifier, the internal signal being received by a control terminal of the first transistor.

According to an embodiment, the circuit is configured to control a turning on of the switch when a saturation is detected or to control a decrease in the value of the variable resistor when a saturation is detected.

According to an embodiment, the circuit is a direct connection between the control terminal of the first transistor and a control terminal of the switch.

According to an embodiment, the circuit comprises a first resistor and a second transistor, series-connected between power supply terminals of the amplifier, a control terminal of the second transistor being connected to the control terminal of the first transistor, and a connection node between the first resistor and the second transistor being connected to a control terminal of the variable resistor.

According to an embodiment, the switch or the variable resistor correspond to a third transistor having a first conduction terminal connected to the first input of the amplifier, and having a second conduction terminal connected to the output of the amplifier.

According to an embodiment, the saturation is a saturation at a high power supply potential, in absolute value, of the amplifier.

According to an embodiment, the first input is an inverting input of the amplifier.

According to an embodiment, the device further comprises: an inductive element having a first terminal coupled, preferably connected, to an output terminal of the device; a switching element coupled to a second terminal of the inductive element; and a control circuit, preferably in pulse width modulation (PWM), configured to control the switching circuit partly based on an output signal of the amplifier.

According to an embodiment, the device is a switched mode voltage converter, preferably a buck, buck-boost, or inverting converter.

Another embodiment provides a microcontroller comprising a switched-mode voltage converter such as previously defined.

Another embodiment provides a method of controlling a device comprising an operational amplifier and a controllable feedback loop connected between an output of the amplifier and a first input, preferably inverting, of the amplifier, the method comprising a step of decreasing or taking down to zero the impedance of the feedback loop when a saturation of the amplifier is detected.

The foregoing and other features and advantages will be discussed in detail in the following non-limiting description of specific embodiments in connection with the accompanying drawings.

DETAILED DESCRIPTION OF ILLUSTRATIVE EMBODIMENTS

Figure 1:
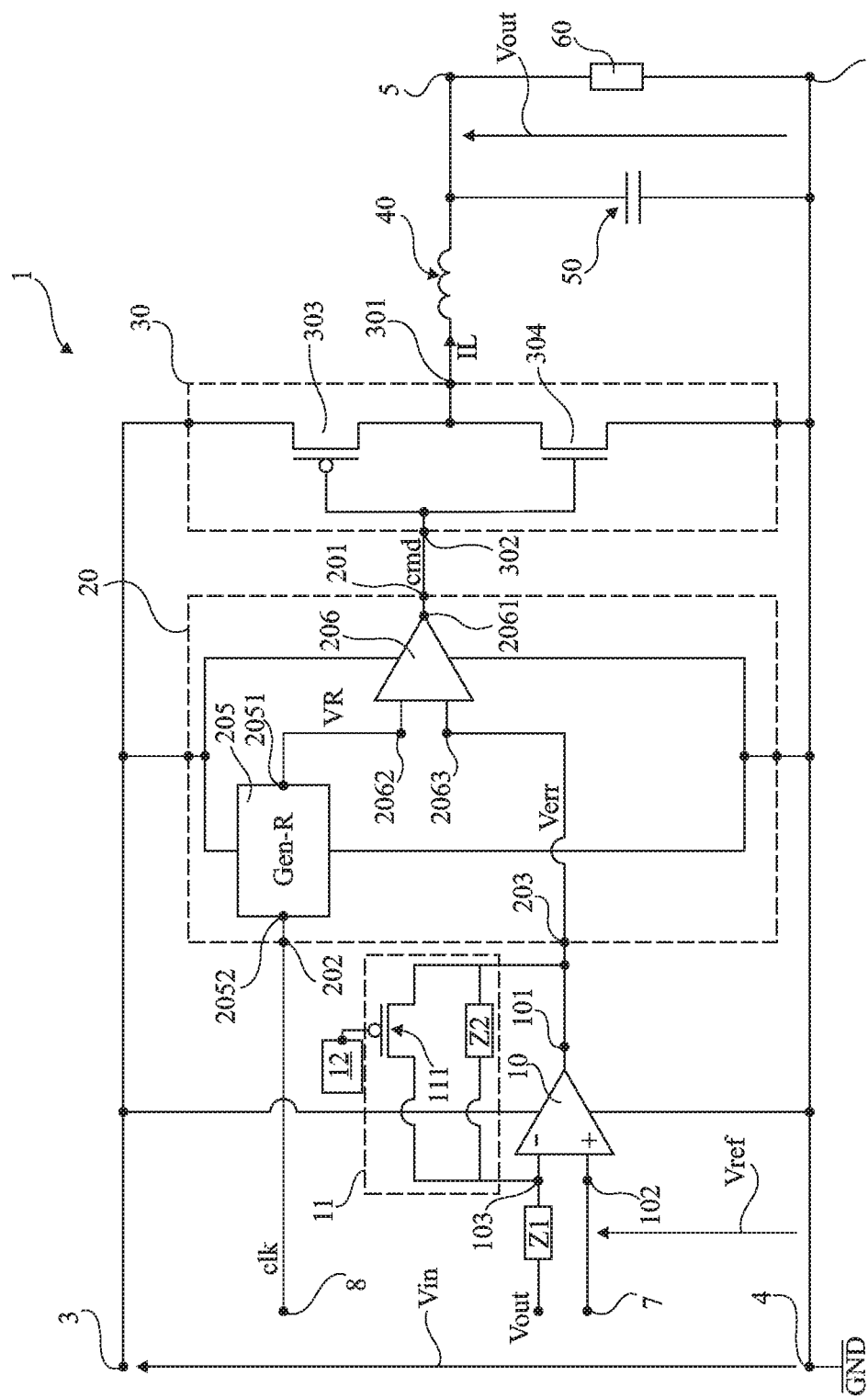
FIG. 1 schematically shows an embodiment of a switched-mode converter, for example, of buck type.

The same elements have been designated with the same reference numerals in the different drawings. In particular, the structural and/or functional elements common to the different embodiments may be designated with the same reference numerals and may have identical structural, dimensional, and/or material properties.

For clarity, only those steps and elements which are useful to the understanding of the described embodiments have been shown and are detailed. In particular, the various switching circuits comprising one or a plurality of cut-off switches of a switched-mode converter, and the circuits and/or methods for controlling such cut-off switches, particularly in pulse-width modulation (PWM), have not been detailed, the described embodiments being compatible with usual switched-mode converters.

Throughout the present disclosure, the term "connected" is used to designate a direct electrical connection between circuit elements with no intermediate elements other than conductors, whereas the term "coupled" is used to designate an electrical connection between circuit elements that may be direct, or may be via one or more intermediate elements.

In the following description, when reference is made to terms qualifying absolute positions, such as terms "front," "back," "top," "bottom," "left," "right," etc., or relative positions, such as terms "above," "under," "upper," "lower," etc., or to terms qualifying directions, such as terms "horizontal," "vertical," etc., unless otherwise specified, it is referred to the orientation of the drawings.

The terms "about," "substantially," and "approximately" are used herein to designate a tolerance of plus or minus 10%, preferably of plus or minus 5%, of the value in question.

FIG. 1 schematically shows an embodiment of a switched-mode converter and more particularly of a DC/DC switched-mode converter, that is, a switched-mode converter which converts a DC power supply voltage into another DC voltage. In this example, the converter is of buck type, that is, the DC voltage Vout that it supplies to a load has a value smaller, in absolute value, than the DC power supply voltage Vin that it receives.

Converter 1 comprises two terminals or nodes 3 and 4 intended to receive the DC power supply voltage Vin and two output terminals or nodes 5 and 6 intended to supply the DC output voltage Vout. Voltage Vin is for example positive and referenced to node 4, where node 4 is typically, ground GND. Voltage Vout is for example positive and referenced to node 6, nodes 4 and 6 being here confounded. In this example, converter 1 further comprises an input terminal 7. Input terminals 7 and 4 are intended to receive a DC reference voltage Vref, for example, that is positive and referenced to terminal 4. In this example, converter 1 also comprises an input terminal 8 intended to receive a periodic binary signal, or clock signal, clk.

Converter 1 comprises an operational amplifier 10. Amplifier 10 has two power supply terminals connected to respective terminals 3 and 4, to be powered with voltage Vin. Amplifier 10 is an error amplifier. In other words, amplifier 10 is configured to supply, at the level of its output terminal 101, an output signal Verr representative of a difference between voltage Vout and reference voltage Vref. Signal Verr is, for example, the voltage available between terminals 101 and 4, for example, referenced to ground 4. Amplifier 10 receives on an input terminal 102, preferably its non-inverting input (+), reference voltage Vref. In other words, terminal 102 of the amplifier is coupled, preferably connected, to terminal 7. Amplifier 10 receives on a second input terminal 103, preferably its inverting input (−), voltage Vout or a voltage representative of voltage Vout. In this example, terminal 103 of amplifier 10 is coupled to terminal 5 of converter 1 by a complex impedance Z1, where complex impedance Z1 may include, e.g., one or a plurality of resistive and capacitive components having impedance Z1 as an equivalent impedance. Preferably, impedance Z1 is connected to respective terminals 5 and 103 or, in other words, there only is impedance Z1 between terminals 5 and 103.

A feedback loop 11, preferably a negative feedback loop, couples output terminal 101 of amplifier 10 to its input terminal 103. In this embodiment, it is provided for the feedback loop 11 to be controllable according to the saturation of amplifier 10. More particularly, it is provided to decrease, or even to take down to zero, the impedance of feedback loop 11 when a saturation of amplifier 10 is detected. In other words, the output 101 of amplifier 10 and input 103 of amplifier 10 tend to be shorted when amplifier 10 saturates. Preferably, when amplifier 10 is no longer saturated, feedback loop 11 is controlled so that its impedance recovers its nominal value, that is, its value in the absence of saturation of the amplifier. Preferably, the nominal value of the impedance of feedback loop 11 is selected to ensure the stability of the amplifier, and more particularly of the loop comprising the amplifier.

In this example, feedback loop 11 comprises a complex impedance Z2, that is, one of a plurality of resistive and capacitive components having impedance Z2, connected between respective terminals 101 and 103, as an equivalent impedance. Feedback loop 11 further comprises a controllable component 111, connected between respective terminals 101 and 103, in this example in parallel with impedance Z2, corresponding to a switch or to a controllable variable resistor. In this example, component 111 is a transistor, preferably a metal-oxide semiconductor (MOS) transistor, preferably having a P channel, having its conduction terminals (source/drain) coupled, preferably connected, to respective terminals 101 and 103.

Although feedback loop 11 corresponds, in this example, to the parallel connection of a complex impedance Z2 and of a controllable component 111, as a variation, the feedback loop may comprise a controllable complex impedance only, connected between terminals 101 and 103. In this variation, the complex impedance is controllable to decrease, or even to take down to zero, the impedance of feedback loop 11 between terminals 101 and 103 when amplifier 10 saturates.

In this embodiment, converter 1 comprises a circuit 12 for controlling feedback loop 11, that is, in this example, controllable component 111. More particularly, circuit 12 is configured to detect a saturation of amplifier 10 and to control feedback loop 11 accordingly. As an example, circuit 12 detects the saturation of amplifier 10 and controls feedback loop 11 by using an internal signal of the amplifier, without for the connection of circuit 12 to the amplifier in order to obtain the internal signal to be shown in FIG. 1. Further, although this is not shown in the example of FIG. 1, circuit 12 may be connected between terminals 3 and 4 to be supplied with voltage Vin.

Converter 1 also comprises a switching control circuit, or cut-off control circuit, 20, for example connected between terminals 3 and 4, so that it can be powered with voltage Vin. Circuit 20 is configured to determine at least one cut-off control signal, or switching control signal, at least partly based on output signal Verr of amplifier 10. The cut-off control signal(s) are preferably pulse-width modulation (PWM) signals, for example, signals having a duty cycle depending on the value of voltage Verr. The cut-off control signal(s) are for example also determined from signal clk.

In the shown example, circuit 20 supplies a single cut-off control signal cmd, at the level of its output terminal 201. Further, circuit 20 comprises an input terminal 202 coupled, preferably connected, to terminal 8 in order to receive signal clk, and an input terminal 203 coupled, preferably connected, to output terminal 101 of amplifier 10 in order to receive voltage Verr.

In this example, circuit 20 more particularly comprises a ramp generator 205 (Gen-R) and a comparator 206, generator 205 and/or comparator 206 being for example connected between terminals 3 and 4 to be supplied with voltage Vin.

Generator 205 is configured to deliver a ramp signal VR at the level of its output terminal 2051. Preferably, signal VR is periodic, with the same period as signal clk, an input terminal 2052 of generator 205 receiving signal clk from input 202. Signal VR is for example a voltage available between terminals 2051 and 4, and referenced to ground terminal 4. As an example, the value of voltage VR is zero at the beginning of each period of signal clk, and increases up to a maximum value, preferably, the value of power supply voltage Vin, reached at the end of each period of signal clk.

Comparator 206 is here configured to deliver, at the level of its output terminal 2061 coupled, preferably connected, to terminal 201, signal cmd. Comparator 206 determines signal cmd from the signals, or voltages VR and Verr that it receives on its respective input terminals 2062 and 2063, terminal 2062 being coupled, preferably connected, to terminal 2051, and terminal 2061 being coupled, preferably connected, to terminal 203.

Converter 1 further comprises a switching circuit 30 (in dotted lines in FIG. 1). Circuit 30 is connected between terminals 3 and 4 to receive power supply voltage Vin. Circuit 30 comprises an output terminal 301. According to the cut-off control signal(s) that it receives from circuit 20, in this example, the signal cmd that it receives on its input terminal 302, circuit 30 is configured to selectively couple terminal 102 to terminal 3, to terminal 4, or possibly to none of terminals 3 and 4. The selective coupling of terminal 301 to terminal 3, to terminal 4, or to none of terminals 3 and 4 is implemented by means of one or a plurality of cut-off switches of circuit 30, controlled by the cut-off control signal(s).

In the shown example, circuit 30 comprises two cut off switches 303 and 304 series-connected between terminals 3 and 4 and controlled by signal cmd. The node of connection of switches 303 and 304 here corresponds to output terminal 301. In this example, switch 303 is a MOS transistor, for example, having a P channel, having its source and its drain respectively connected to terminals 301 and 3, and switch 304 is a MOS transistor, for example having an N channel, having its drain and its source respectively connected to terminals 301 and 4, the gates of transistors 303 and 304 being coupled, preferably connected, to terminal 302.

Converter 1 further comprises an inductive element 40, for example, an inductance, coupling terminal 301 of circuit 30 to terminal 5 of converter 1, inductive element 40 being preferably connected to respective terminals 301 and 5. As a variation, inductive element 40 may be external to converter 1. Further, in this example, a capacitive element 50, for example, a capacitor, couples terminals 5 and 6, capacitive element 40 being preferably connected to respective terminals 5 and 6. The capacitive element may form part of converter 1 or be external to the converter.

In operation, signal clk and voltages Vref and Vin are supplied to converter 1. Load 60, which has converter 1 supplying voltage Vout thereto, is connected between terminals 5 and 6. According to signal clk and to voltages Vref, Vin, and Vout, and more particularly according to voltages VR and Verr, circuit 20 generates a signal cmd to maintain across the assembly of load 60 and of capacitive element 50 a voltage Vout having its value depending on reference voltage Vref, preferably a voltage Vout having a value substantially equal, preferably equal, to that of voltage Vref. More particularly, in the described example, when switches 303 and 304 are respectively on and off, for example, when signal cmd is in a low logic state, for example, equal to ground, and voltage Vout is smaller than voltage Vin, power is stored in inductive element 40 and current IL in the inductive element increases. Conversely, when switches 303 and 304 are respectively off and on, for example, when signal cmd is in a high logic state, for example equal to Vin, power is given back by inductive element 40 to the assembly of load 60 and of capacitive element 50 and current IL in the inductive element decreases.

Preferably, when voltage Vout is equal to voltage Vref, converter 1, and more particularly amplifier 10, are configured so that voltage Verr is equal to voltage Vref.

When the current drawn by load 60 increases, this generally causes a corresponding decrease of voltage Vout with respect to reference voltage Vref. This results in an increase of voltage Verr, and thus an increase, for each period of signal cmd, of the duration of its low logic state, which tends to take voltage Vout back to voltage Vref.

When a decrease in voltage Vout with respect to voltage Vref causes a saturation of amplifier 10, that is, the voltage Verr that it supplies reaches a maximum value, that is, the value of power supply voltage Vin of the amplifier, circuit 12 controls feedback loop 11 to decrease, or even to take down to zero, the impedance thereof. As a result, voltage Verr tends towards the voltage present on input 103 of the amplifier, particularly due to the fact that capacitance 50 between terminals 5 and 6 is greater, for example, at least 5 times, preferably at least 10 times greater, than a capacitance present between terminals 101 and 4, that is, the capacitance of node 101. Since voltage Vout is smaller than voltage Vin, the voltage between terminals 103 and 4 is smaller than saturation voltage Vin of amplifier 10 and feedback loop 11 tends to impose a voltage value Verr smaller than that of saturation voltage Vin of amplifier 10. This enables to decrease the time necessary for amplifier 10 to leave the saturated state with respect to the case of a converter 1 which would comprise no controllable feedback loop 11 and no circuit 12.

Indeed, in the absence of controllable feedback loop 11 and of circuit 12, despite the fact that, after a decrease in voltage Vout having caused a saturation of amplifier 10, voltage Vout has increased up to a value such that voltage Verr should be smaller than the saturation voltage of amplifier 10, the amplifier could remain saturated for still a few moments, which might result in oscillations of voltage Vout and/or in significant current peaks IL.

To avoid such a phenomenon, it could have been devised to power amplifier 10 with a voltage Vin sufficiently high for amplifier 10 never to saturate. However, this would result in an increase in the converter power consumption, which is not desirable. This would further result in limiting the minimum operating power supply voltage of converter 1, which may be particularly disturbing when voltage Vin is supplied by a cell or a battery.

Figure 2:
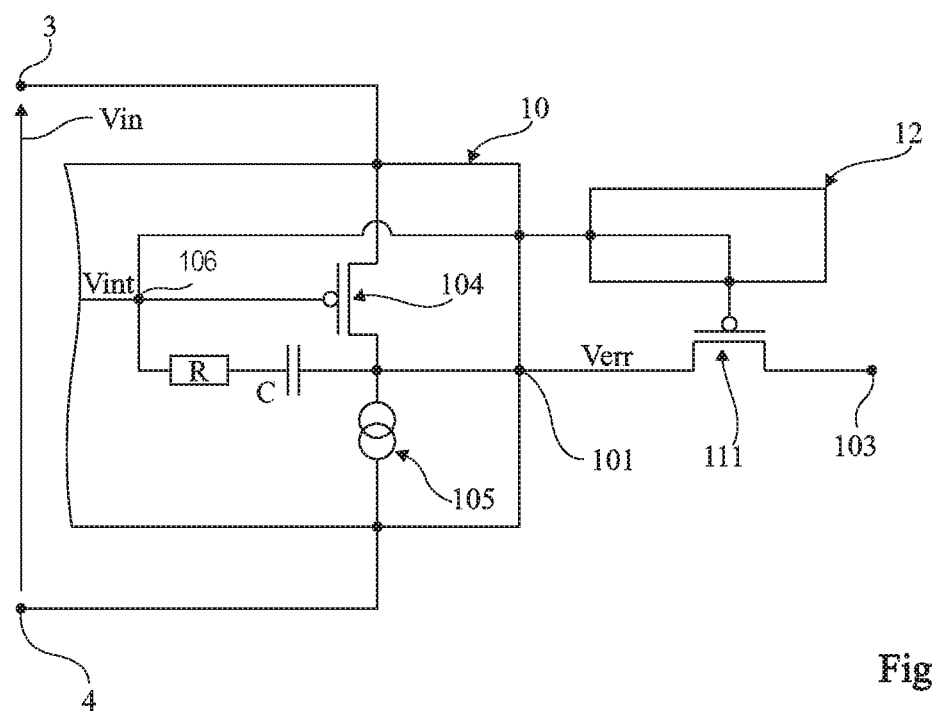
FIG. 2 shows in more detailed fashion a portion of the converter of FIG. 1 according to an embodiment.

FIG. 2 shows in more detailed fashion a portion of converter 1 according to an embodiment. More particularly, FIG. 2 shows circuit 12, controllable component 111, terminals 3 and 4, and a portion only of amplifier 10, that is, its input terminal 103 and its output stage supplying voltage Verr.

In this embodiment, the output stage, or gain stage, of amplifier 10 comprises a MOS transistor 104, for example, having a P channel, and a current source 105 which biases transistor 104. Transistor 104 and current source 105 are series-connected between terminals 3 and 4, transistor 104 here being connected to terminal 3. Output terminal 101 of amplifier 10 corresponds to the connection node between transistor 104 and current source 105, that is, here, to the source of transistor 104. The control terminal (gate) 106 of transistor 104 receives an internal signal Vint of amplifier 10, representative of the differential voltage of amplifier 10, that is, of the voltage difference between inputs 102 and 103 of amplifier 10. As an example, signal Vint is an output signal of a differential pair. In the shown example, a Miller compensation is provided in the output stage of amplifier 10, a resistor R and a capacitor C being series-connected between gate 106 and source 101 of transistor 104.

In this embodiment, circuit 12 is a direct connection between the control terminal (gate) 106 of transistor 104 and the control terminal of component 111, that is, the gate of transistor 111 in this example. In this embodiment, transistor 111 is controlled in discrete fashion, in all or nothing. In other words, component 111 corresponds to a switch.

The saturated or non-saturated state of amplifier 10 depends on signal Vint controlling transistor 104. Thus, signal Vint enables to detect a saturation of amplifier 10. More particularly, in the shown example, during a saturation of amplifier 10, voltage Vint between the gate of transistor 104 and terminal 4 is zero or close to zero. Thus, when the amplifier saturates, signal Vint applied to the control terminal of switch 111 causes the turning on thereof. In other words, voltage Vint between the control terminal of transistor 111 and terminal 4 is such that transistor 111 turns on.

Figure 3:
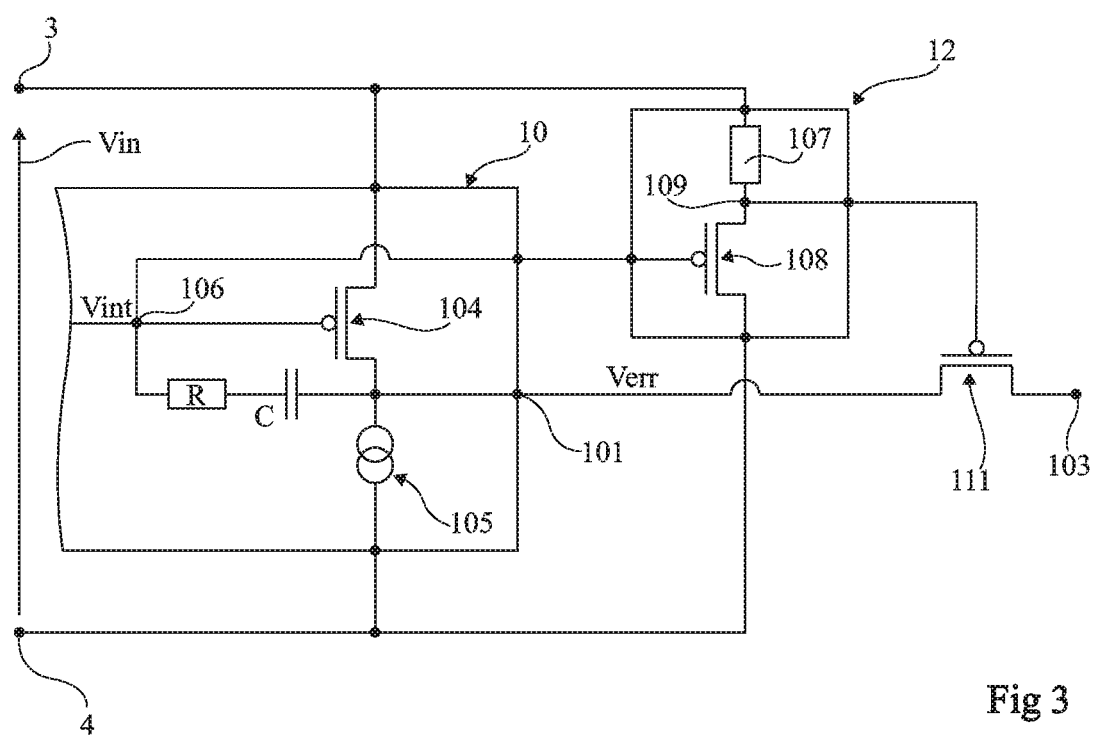
FIG. 3 shows in more detailed fashion a portion of the converter of FIG. 1 according to another embodiment.

FIG. 3 shows in more detailed fashion a portion of converter 1 according to another embodiment. The embodiment of FIG. 3 differs from that of FIG. 2 only by its circuit 12 and by the fact that component 111 corresponds to a controllable variable resistor.

In this embodiment, circuit 12 is connected to terminals 3 and 4 to be powered with voltage Vin. Circuit 12 comprises a resistor 107 and a MOS transistor 108, for example, having a P channel, series-connected between terminals 3 and 4. In this example, a conduction terminal, here, the source, of transistor 108 is connected to terminal 4, a terminal of resistor 107 is connected to terminal 3, and the connection node 109 between transistor 108 and resistor 107 forms the output of circuit 12, node 109 being connected to the control terminal of controllable variable resistor 111, that is, to the control terminal (gate) of transistor 111 in this example. Further, the control terminal of transistor 108 is connected to the control terminal of transistor 104 of amplifier 10 to receive internal signal Vint.

The operation is similar to what has been described in relation with FIG. 2, with the difference that, instead of controlling component 111 in discrete fashion (switch 111 off or on), component 111, in this example, transistor 111, is here linearly controlled, the value of variable resistor 111 decreasing as amplifier 10 approaches its saturated state, down to a minimum value when the amplifier saturates. This results in a less abrupt decrease of the impedance of feedback loop 11 as in the embodiment described in relation with FIG. 2, which results in a less abrupt response of converter 1 after a saturation of amplifier 10.

Circuit 12 and component 111 described in relation with FIGS. 2 and 3, in particular when component 111 is a transistor, are particularly simple to implement, have a low bulk and a low power consumption.

Figure 4:
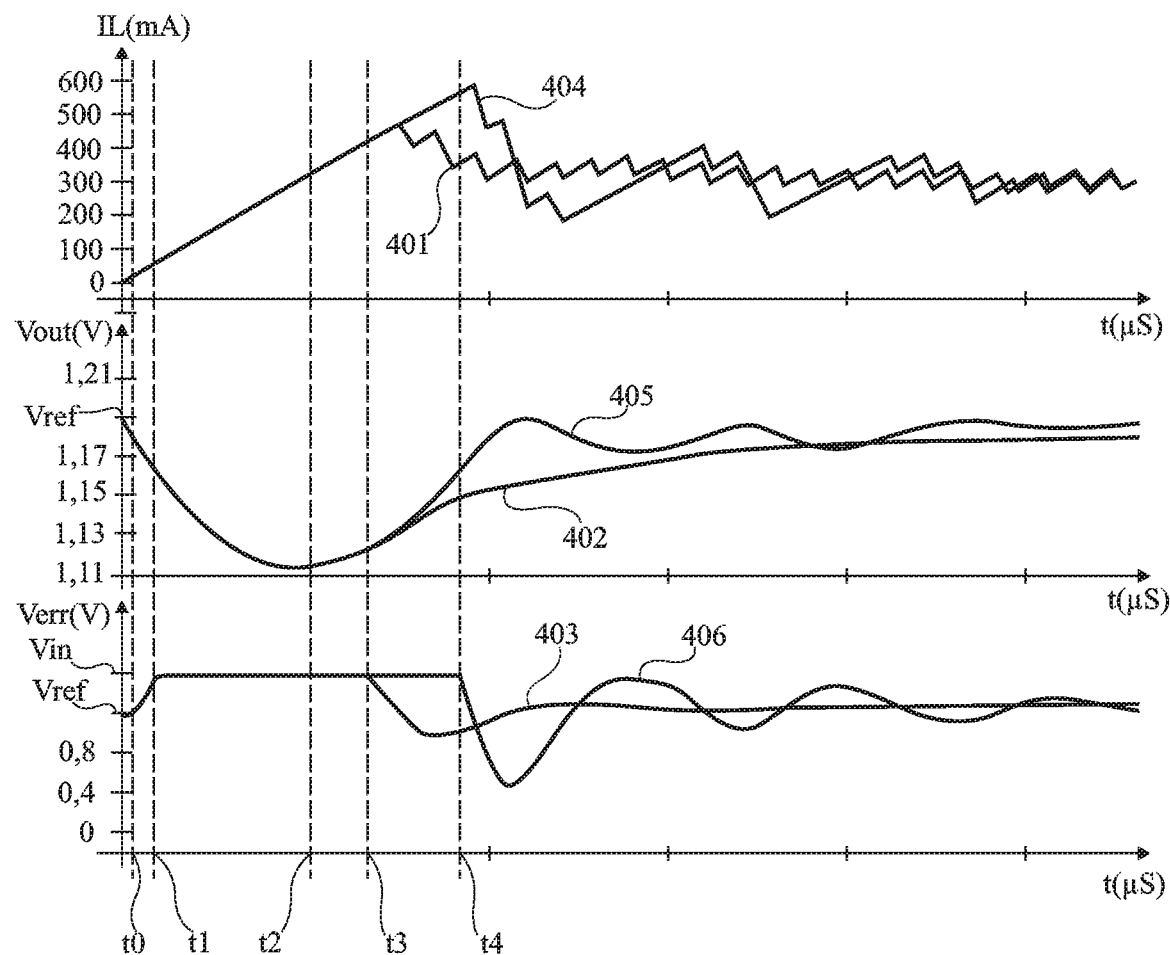
FIG. 4 shows simulation results.

FIG. 4 shows simulation results.

FIG. 4 comprises timing diagrams 401, 402, and 403 obtained for a converter 1 according to the embodiment of FIG. 3, and timing diagrams 404, 405, and 406 obtained for a converter differing from the converter of timing diagrams 401, 402, and 403 by the fact that it does not comprise component 111 and circuit 12. Timing diagrams 401, 402, 403, 404, 405, and 406 share the same time scale t, in abscissa and in microseconds (s), and illustrate the operation of the converters during a current draw by load 60 causing a saturation of amplifier 10. In the example of FIG. 4, the difference between two successive abscissa gradings correspond to 2 μs. In this example, voltage Vin is equal to 1.6 V and voltage Vref is equal to 1.2 V.

More particularly, timing diagrams 401 and 404 illustrate the variation of current IL, in milliamperes (mA), in inductive element 40 (FIG. 1), timing diagrams 402 and 405 illustrating the variation of voltage Vout, in volts (V), and timing diagrams 403 and 406 illustrating the variation of voltage Verr, in volts (V).

At a time t0, voltage Vout decreases after the current draw, which results in an increase in voltage Verr up to its saturation value, 1.6 V in this example, that it reaches at a next time t1. As long as voltage Verr remains equal to its maximum value, circuit 20 (FIG. 1) controls circuit 30 (FIG. 1) so that terminal 102 of inductive element 40 is coupled to terminal 3 and current IL increases.

At a time t2 following time t1, in this example equal to plus 50 μs, voltage Vout reaches a minimum value, amplifier 10 being still saturated and voltage Verr being equal to 1.6 V.

At a time t3 following time t2, while voltage Vout increases, in the converter corresponding to timing diagrams 401, 402, and 403, due to the fact that the impedance of feedback loop 11 is decreased, or even zero, since the saturation of amplifier 10 (time t1), voltage Verr starts decreasing. In contrast, in the converter corresponding to timing diagrams 404, 405, and 406, voltage Verr only starts decreasing from a time t4 subsequent to time t3.

Thus, from time t3, circuits 20 and 30 of the converter of timing diagrams 401, 402, and 403 operate so that phases of increase of current IL alternate with phases of decrease of current IL, while in the converter of timing diagrams 404, 405, and 406, this only occurs from time t4.

It can then be observed that voltage Vout of the converter of timing diagrams 401, 402, and 403 progressively increases up to the 1.2-V value, with no oscillation, conversely to what occurs in the converter of timing diagrams 404, 405, and 406. Due to the fact that voltage Verr depends on voltage Vout, voltage Verr exhibits little or no oscillations in the converter of timing diagrams 401, 402, and 403, conversely to voltage Verr of the converter of timing diagrams 404, 405, and 406. Further, voltage Verr of the converter of timing diagrams 401, 402, and 403 more rapidly recovers a stable value equal to voltage Vref than that of the converter of timing diagrams 404, 405, and 406.

It can then also be observed that, as compared with current IL of the converter of timing diagrams 404, 405, and 406, current IL of the converter of timing diagrams 401, 402, and 403 rather exhibits a regular alternation of phases of increase and of decrease of its value and, further, exhibits a current IL having a smaller maximum value.

Various embodiments of a switched-mode converter have been described herein-above. Such embodiments are for example adapted to a use in a microcontroller, for example, in a unit of power management (PMU) of the various elements forming the microcontroller (e.g., volatile memory such as a RAM, non-volatile memory such as a flash memory, data, address, and/or control bus, processing unit, input/output interfaces, etc.). In this case, the converter belongs to the microcontroller.

Further, although the case of a buck-type voltage converter has been described herein-above, it is within the abilities of those skilled in the art to adapt, based on the structural and/or functional indications of the present disclosure, the described embodiments to any power converter using an error amplifier to implementing pulse width modulation controlled switching operations, for example, a boost converter, a buck-boost converter, which may be inverting (positive voltage Vin and negative voltage Vout) or not. Such other converters may further have one or a plurality of outputs, such as for example, a buck converter with a plurality of outputs, a buck/boost converter with a positive output and a negative output, etc.

Further, although a saturation of amplifier 10 at the high value, in absolute value, of its power supply voltage Vin has more particularly be described, it is within the abilities of those skilled in the art to adapt the described embodiments to the case of a saturation of the amplifier at its low value, in absolute value. In such a case, transistor 104 of the output stage of amplifier 10 (FIGS. 2 and 3) may for example be an N-channel transistor, current source 105 being then connected between transistor 104 and terminal 3. Controllable component 111 may then be formed with an N-channel transistor, as well as transistor 108 in the embodiment of FIG. 3.

More generally, although embodiments where the transistors are MOS transistors have been described, it is within the abilities of those skilled in the art to adapt these embodiments to the case where at least some of the transistors used are bipolar transistors.

Various embodiments and variations have been described. Those skilled in the art will understand that certain features of these various embodiments and variations may be combined, and other variations will occur to those skilled in the art. In particular, the embodiments described herein-above are not limited to the circuits 20 and 30 shown in FIG. 1. For example, control circuit 20 may comprise a state machine and/or supply a plurality of cut off control signals (one per cut-off switch of circuit 30). For example, the control circuit may be adapted to implement the control methods described in French Application No. 1855400 of the applicant.

More generally, an assembly of an operational amplifier 10, of a controllable component 111 (variable switch or resistor) coupling the input, preferably inverting, to the amplifier output, and of a control circuit 12 of the controllable component, in other circuits than a voltage converter, may be provided. For example, such an assembly may be provided in a circuit where the amplifier is an error amplifier between a reference voltage and an output voltage of the circuit, the output signal of the amplifier determining a control signal internal to the circuit.

Finally, the practical implementation of the described embodiments and variations is within the abilities of those skilled in the art based on the functional indications given herein-above. In particular, concerning component 111 and/or circuit 12, it is within the abilities of those skilled in the art to provide other implementations.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. A device comprising:
an operational amplifier;
a feedback loop coupled between a first input of the operational amplifier and an output of the operational amplifier, the feedback loop being controllable according to a saturation of the operational amplifier, wherein the feedback loop comprises a first circuit coupled between the first input and the output of the operational amplifier, the first circuit comprising a first transistor having a first conduction terminal coupled to the first input of the operational amplifier, and a second conduction terminal coupled to the output of the operational amplifier, wherein the first input of the operational amplifier is an inverting input of the operational amplifier; and
an amplifier saturation detection circuit configured to control the feedback loop to decrease an impedance of the feedback loop when the operational amplifier saturates.

2. The device of claim 1, wherein the amplifier saturation detection circuit is configured to detect a saturation of the operational amplifier and control the feedback loop based on an internal signal of the operational amplifier.

3. The device of claim 2, wherein the operational amplifier comprises a second transistor comprising:
a conduction terminal forming the output of the operational amplifier; and
a control terminal configured to receive the internal signal.

4. A device comprising:
an operational amplifier;
a feedback loop coupled between a first input of the operational amplifier and an output of the operational amplifier, the feedback loop being controllable according to a saturation of the operational amplifier, wherein the feedback loop comprises a first circuit coupled between the first input and the output of the operational amplifier; and
an amplifier saturation detection circuit configured to control the feedback loop to decrease an impedance of the feedback loop when the operational amplifier saturates, wherein the amplifier saturation detection circuit is configured to detect a saturation of the operational amplifier and control the feedback loop based on an internal signal of the operational amplifier, wherein the operational amplifier comprises a first transistor comprising: a conduction terminal forming the output of the operational amplifier, and a control terminal configured to receive the internal signal, and wherein the first circuit is a switch, and wherein the amplifier saturation detection circuit is configured to control a turning on of the switch when a saturation is detected.

5. The device of claim 4, wherein the amplifier saturation detection circuit is directly connected between the control terminal of the first transistor and a control terminal of the switch.

6. A device comprising:
an operational amplifier;
a feedback loop coupled between a first input of the operational amplifier and an output of the operational amplifier, the feedback loop being controllable according to a saturation of the operational amplifier, wherein the feedback loop comprises a first circuit coupled between the first input and the output of the operational amplifier; and
an amplifier saturation detection circuit configured to control the feedback loop to decrease an impedance of the feedback loop when the operational amplifier saturates, wherein the amplifier saturation detection circuit is configured to detect a saturation of the operational amplifier and control the feedback loop based on an internal signal of the operational amplifier, wherein the operational amplifier comprises a first transistor comprising: a conduction terminal forming the output of the operational amplifier, and a control terminal configured to receive the internal signal, and wherein the first circuit comprises a controllable variable resistor, and wherein the amplifier saturation detection circuit is configured to control a decrease in the value of the controllable variable resistor when a saturation is detected.

7. The device of claim 6, wherein the controllable variable resistor comprises a transistor.

8. The device of claim 6, wherein the amplifier saturation detection circuit comprises a first resistor coupled between a first power supply terminal of the operational amplifier and an intermediate node, and a second transistor coupled between the intermediate node and a second power supply terminal of the operational amplifier, wherein the second transistor comprises a control terminal coupled to the control terminal of the first transistor, and wherein the intermediate node is coupled to a control terminal of the controllable variable resistor.

9. The device of claim 1, wherein the saturation is a saturation at a high power supply potential, in absolute value, of the operational amplifier.

10. The device of claim 1, further comprising:
an inductive element having a first terminal coupled to an output terminal of the device;
a switching circuit coupled to a second terminal of the inductive element; and
a control circuit configured to control the switching circuit at least partly based on an output signal of the operational amplifier.

11. The device of claim 1, wherein the device is a switched-mode voltage converter of the buck, buck-boost, or inverting type.

12. A microcontroller comprising the switched-mode voltage converter of claim 11.

13. A method of operating a switched-mode voltage converter, the method comprising:
receiving an input voltage with a switching circuit;
producing an output voltage;
receiving a reference voltage with a first input of an amplifier;
receiving a feedback signal with a second input of the amplifier, the feedback signal being based on the output voltage;
producing an error signal at an output of the amplifier, wherein the switching circuit switches based on the error signal;
detecting a saturation of the amplifier; and
decreasing an impedance between the output of the amplifier and the second input of the amplifier when the saturation of the amplifier is detected.

14. The method of claim 13, wherein decreasing the impedance comprises decreasing the impedance down to zero.

15. The method of claim 13, wherein decreasing the impedance comprises turning on a transistor that is directly connected between the output of the amplifier and the second input of the amplifier.

16. A buck converter comprising:
an output stage having an output terminal configured to be coupled to an inductor;
a comparator having an output coupled to the output stage;
an amplifier comprising:
a first input configured to receive a reference voltage;
a second input coupled to the output terminal of the output stage; and
an output coupled to an input of the comparator;
a feedback loop circuit coupled between the second input of the amplifier and the output of the amplifier; and
a first circuit configured to detect a saturation of the amplifier and to decrease an impedance of the feedback loop circuit when the amplifier saturates.

17. The buck converter of claim 16, wherein the amplifier further comprises a first transistor having a first conduction terminal coupled to the output of the amplifier, wherein the first circuit comprises a second transistor having a control terminal coupled to a control terminal of the first transistor, and wherein the feedback loop circuit comprises a third transistor having a control terminal coupled to the second transistor and a first conduction terminal coupled to the first conduction terminal of the first transistor.

18. The buck converter of claim 16, further comprising a controllable variable resistor, and wherein the first circuit is configured to control a decrease in the value of the controllable variable resistor when the amplifier saturates.

19. The buck converter of claim 16, wherein the first circuit comprises a switch, and wherein the first circuit is configured to control a turning on of the switch when the amplifier saturates.

20. The device of claim 1, wherein the first circuit comprises a controllable variable resistor, and wherein the amplifier saturation detection circuit is configured to control a decrease in the value of the controllable variable resistor when a saturation is detected.

21. The device of claim 1, wherein the first transistor is of the p-type, and wherein the amplifier saturation detection circuit comprises a second transistor of the p-type having a current path coupled to a control terminal of the first transistor.

* * * * *